(12) United States Patent
Jones

(10) Patent No.: US 7,308,357 B2
(45) Date of Patent: Dec. 11, 2007

(54) COMPONENT NAVIGATION SYSTEM FOR A SAILING VESSEL

(76) Inventor: John Edgar Jones, 822 Walbrook Dr., Houston, TX (US) 77062-4030

( * ) Notice: Subject to any disclaimer, the term of this patent is extended or adjusted under 35 U.S.C. 154(b) by 182 days.

(21) Appl. No.: 10/904,500

(22) Filed: Nov. 12, 2004

(65) Prior Publication Data
US 2006/0104038 A1  May 18, 2006

(51) Int. Cl.
*G05B 15/00* (2006.01)

(52) U.S. Cl. ................................. 701/200; 318/588

(58) Field of Classification Search ........... 701/200; 318/588, 589, 583, 584; 73/178 R; 361/517, 361/531, 534, 535, 538
See application file for complete search history.

(56) References Cited

U.S. PATENT DOCUMENTS

| | | | |
|---|---|---|---|
| 4,131,851 A | | 12/1978 | Martiny et al. |
| 4,253,149 A | * | 2/1981 | Cunningham et al. ........ 701/21 |
| 4,513,378 A | * | 4/1985 | Antkowiak ................ 701/217 |
| 4,675,803 A | * | 6/1987 | Kendall et al. ................ 700/2 |
| 4,777,615 A | * | 10/1988 | Potash ......................... 710/300 |
| 4,939,661 A | | 7/1990 | Barker et al. |
| 5,075,693 A | | 12/1991 | McMillan et al. |
| 5,268,844 A | * | 12/1993 | Carver et al. ............... 701/200 |
| 5,467,282 A | | 11/1995 | Dennis |
| 5,592,382 A | | 1/1997 | Colley |
| 5,610,815 A | | 3/1997 | Gudat et al. |
| 5,696,667 A | | 12/1997 | Berding |
| 5,812,377 A | | 9/1998 | Golbach |
| 5,884,213 A | | 3/1999 | Carlson |
| 5,940,288 A | | 8/1999 | Kociecki |
| 5,956,291 A | * | 9/1999 | Nehemiah et al. .......... 367/131 |
| 6,241,530 B1 | | 6/2001 | Eddy et al. |
| 6,254,435 B1 | | 7/2001 | Cheong et al. |
| 6,273,771 B1 | | 8/2001 | Buckley et al. |
| 2004/0243859 A1 | * | 12/2004 | Mueller et al. ............. 713/300 |
| 2005/0146875 A1 | * | 7/2005 | Klein ......................... 362/253 |
| 2006/0002235 A1 | * | 1/2006 | Knowles et al. ............ 367/181 |

* cited by examiner

*Primary Examiner*—Dalena Tran
(74) *Attorney, Agent, or Firm*—Jennifer S. Sickler; Gardere Wynne Sewell LLP

(57) ABSTRACT

A component navigational system comprising a video interface unit and multiple purpose-built printed circuit boards that are presented in a card cage unit. A number of the printed circuit boards will be further connected to input sensors for measuring various parameters while other printed circuit boards will be connected to specific output devices. The individual units are comprised of computer and/or electronic and/or electro/mechanical devices. The video interface unit provides single point access to all navigational data as well as providing a user interface for the system. The card-cage unit has multiple bus structures with a plurality of sockets for connection to a power supply, a central processing unit and the purpose built printed circuit boards. The purpose-built printed circuit boards and the central processing unit will communicate bi-directionally by means of a parallel signal bus. The central processing unit will thus be able to process input data, display appropriate information and logically control a specific output device.

38 Claims, 7 Drawing Sheets

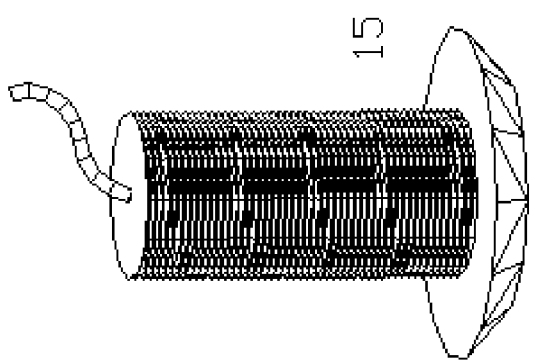
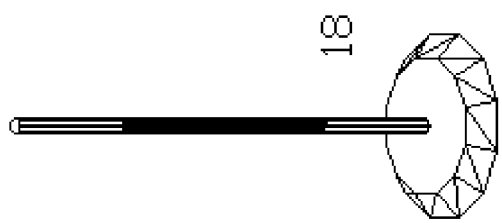
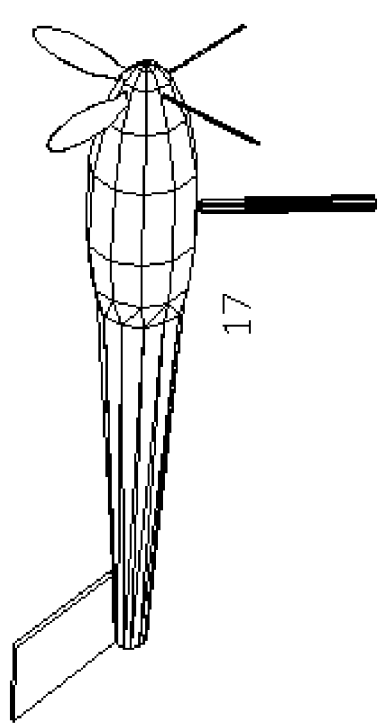
Fig 6

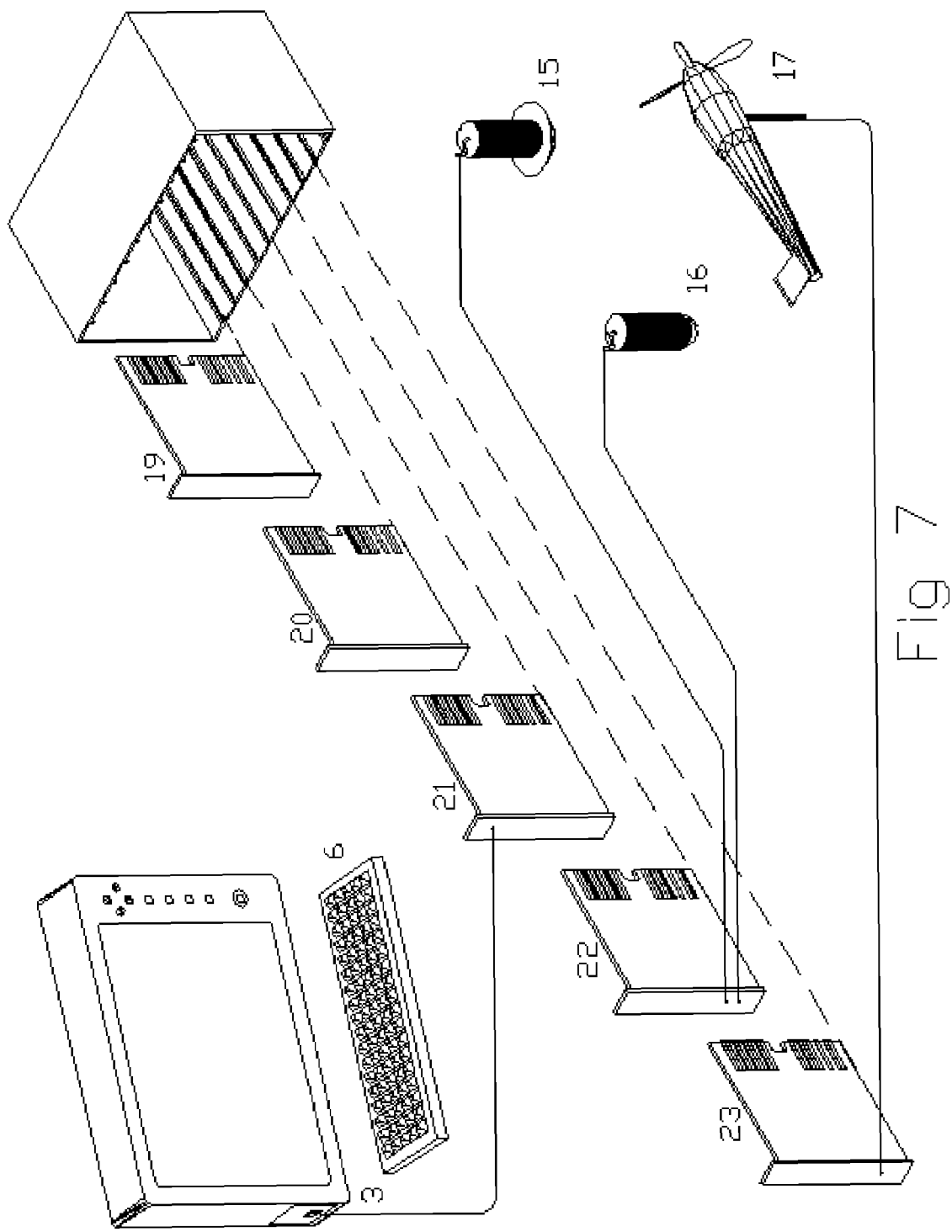

COMPONENT NAVIGATION SYSTEM FOR A SAILING VESSEL

CROSS-REFERENCE TO RELATED APPLICATIONS

| | | | |
|---|---|---|---|
| 4131851 | December, 1978 | Martiny et al. | 381/2 |
| 4939661 | July, 1990 | Barker et al. | 364/521 |
| 5075693 | December, 1991 | McMillan et al. | 342/457 |
| 5467282 | November, 1995 | Dennis | 364/449 |
| 5592382 | January, 1997 | Colley | 364/449 |
| 5610815 | March, 1997 | Gudat et al. | 364/424 |
| 5696667 | December, 1997 | Berding | 361/877 |
| 5812377 | September, 1998 | Golbach | 361/759 |
| 5884213 | March, 1999 | Carlson | 701/206 |
| 5940288 | August, 1999 | Kociecki | 363/144 |
| 6241530 | June, 2001 | Eddy et al. | 439/61 |
| 6254435 | July, 2001 | Cheong et al. | 439/637 |
| 6273771 | August, 2001 | Buckley et al. | 440/84 |

BACKGROUND ON INVENTION

1. Field of Invention

The present design is generally related to the collection and display of navigational data for a sailing vessel, more particularly, to a data acquisition system which utilizes a parallel bus to connect a plurality of circuit boards which are in parallel communication with each other and a computer/controller, and which are in turn connected to a plurality of input and output devices.

2. Description of Prior Art

On modern sailing vessels it is necessary to have reliable navigation instruments on board. Traditionally instruments that indicate vessel speed, depth, wind speed and direction have been purchased separately, and each instrument is equipped with it's own display and user interface, typically function keys. The number of instruments available today has increased sharply with the availability of advanced marine radar, GPS receivers, gyrocompasses and chart-plotters. These instruments must be mounted in such a way that they can be viewed easily in the cockpit. These instruments are typically mounted in one of two ways: either a bulkhead mount or a cluster mount around the steering wheel pedestal.

The Bulkhead Mount: This mounting method is achieved by cutting multiple penetrations in the bulkhead of the vessel typically to one side of the main hatchway. The instruments are then mounted in these penetrations where they can be viewed from the wheel or tiller. The instruments are then electrically connected to a power source and the instrument's sensor with wiring and cables. This wiring is generally run on the backside of the bulkhead or inside the boat cabin. Instruments may also be mounted on the surface of the bulkhead with a mounting bracket. In this case the wiring is typically run on the exterior bulkhead surface.

The Pedestal Cluster: This mounting method is achieved by mounting the instruments in some configuration about the steering wheel pedestal. Instruments may be mounted with individual mounting brackets or they may be mounted in a common console. Wiring to these instruments is typically fed through the cockpit floor, and it is strapped to the wheel pedestal and routed to the instruments.

Each method has advantages and drawbacks. Bulkhead mounted devices have wiring that is exposed on the bulkhead exterior surface or inside the cabin where it is unsightly. Protecting this wiring from salt-water corrosion and impact is difficult at best. Further the helmsman's view of a bulkhead-mounted instrument is easily obscured because passengers and crew are usually seated directly by the bulkheads where the instruments are mounted. Instruments mounted on the pedestal are easily viewed, but there is little room for many instruments. Most pedestal-mounted instruments are exposed and can be easily impacted or damaged. Multiple power, antenna and sensor cables are again exposed and unprotected.

With the extraordinary advances in technology today, many improvements have been made in the area of marine instrumentation. Many traditional instruments are now manufactured with serial communication (networking) capability built in. Multiple units can be networked to a laptop computer to assimilate data. Many autopilot units are now capable of serial communication with GPS receivers, chart-plotters and radar units. Mounting and utilizing all these devices in such a way that they are presented in a functional and convenient manner is difficult at best.

The drawbacks to the state-of-the-art methodology are that each instrument is presented in it's own housing, and each instrument must provide it's own display, user interface and power regulation. Also each instrument is mounted separately in a unique location. Connecting all these devices to power sources, antenna, sensors and serial communication systems is a difficult and laborious task. This installation requires large amounts of wiring and cable, which are difficult to conceal, protect and maintain. This approach is expensive, redundant, unsightly and generally tedious to use.

BRIEF SUMMARY OF INVENTION

A component navigational system in accordance with the present design consists of a video interface unit and multiple purpose-built printed circuit boards that are presented in a card cage unit. A number of the printed circuit boards are further connected to input sensors for measuring various parameters while other printed circuit boards are connected to specific output devices. The video interface unit provides single point access to all navigational data as well as providing a user interface for the system. The card-cage unit has multiple bus structures with a plurality of sockets for connection to a power supply, a central processing unit and the purpose built printed circuit boards. These printed circuit boards and the central processing unit will communicate bi-directionally by means of a parallel signal bus. The central processing unit will thus be able to process input data, display appropriate information and logically control a specific output device.

The video interface unit (VIU) will consist of a flat screen display unit mounted in a weatherproof housing. This unit will be provided with function keys and/or a "touch screen" and a series of menus through which the user can configure the unit and display various graphic screens. Because of its small size and low profile, the VIU can be mounted to the wheel pedestal, a bulkhead or a cockpit wall. This VIU will communicate to the card-cage unit over a single CAT5 network cable using keyboard-video-mouse (KVM) technology. The VIU will provide data displays from all of the purpose-built printed circuit boards and the input sensors. This approach eliminates all but two (2) cables running to the cockpit. This approach also reduces the number of navigational instrument displays unit in the cockpit to one. A second VIU equipped with a keyboard may also be located at the navigation center or some other location.

The card-cage unit (CCU) will consist of a framework to support and protect the purpose-built printed circuit cards and a back plane, which has integrated communication and power buses. The bus work will have multiple parallel electrical conductors to provide a parallel communication pathway between the CPU and the purpose-built printed circuit boards. Multiple parallel electrical conductors will also be provided to distribute power from the power supply to the printed circuit boards and the CPU. The back plane will have a multiple edge connector sockets electrically connected to the power and communication buses. These sockets will "mate" with electrical contacts on the purpose-built printed circuit boards such that the printed circuit boards will be electrically connected to the power bus and the communication bus. The CCU will be housed in an enclosure to protect the unit from impact and exposure to a harsh or corrosive environment. This unit will have appropriate penetrations for cable and wire connections, as well as appropriate wiring and waterproofing appliances. The CCU shall be located in a protected area such as under a navigation center or inside a storage compartment. The multitude of wires and cables can be installed to the CCU in a protected fashion that is out of site.

The power supply will consist of electronic components that will provide filtered, protected and regulated voltage to the components of the navigation system. This power supply will draw power from the boat's 12-volt DC power system. The power supply will be designed to reside in the card-cage unit, and it will be connected to the power bus via the edge connector socket.

The central processing unit will consist of a microprocessor, memory, an operating system and the necessary electronic components to produce a functional computer/controller. The CPU will be designed to reside in the card cage unit. This CPU will attach to the signal bus and power bus via edge connector sockets. The CPU will process data presented by the printed circuit boards and update graphics displays and adjust output devices through other printed circuit cards.

The purpose-built printed circuit boards will be designed to perform one or more functions such as a depth sounder, an anemometer, a speed indicator, etc. These boards will have sufficient electrical or electronic components to perform that board's specific function. These boards may include firmware and/or software suitable for that board's specific function. The circuit boards will have edge contacts on the inner edge (the back edge) of the board. These contacts are designed to "mate" to the edge connector sockets located on the back plane. The circuit boards will then be connected to a specific input sensor, which will be suited for that board's specific function. The input sensor(s) will be connected to the outer edge (the front side) of the circuit board. Other purpose-built circuit boards may include but are not limited to a video/KVM board, a GPS receiver board, a radar interface board, a DC power monitor board, an autopilot interface board, a gyrocompass board, a collision avoidance board, a weather band radio receiver, an engine parameter board, a CD-ROM board, a read/write CD-ROM board or a chart-plotter board.

The sensors will be electronic or electro/mechanical in nature. An electronic sensor may be but is not limited to a temperature probe or a sonar transducer. An electromechanical transducer may be but is not limited to a paddle-wheel type speed sensor or a wind vane. Other inputs may be fuel, water or bilge level sensing units.

The output devices will be electronic or electro/mechanical in nature. An output device may be a bilge pump or a ventilator for the engine compartment. Another device may be the actuator of an autopilot system or a backstay adjuster.

BRIEF DESCRIPTION OF DRAWINGS

FIG. 6: Various sensors and transducers
FIG. 7: The exploded view of the system

DETAILED DESCRIPTION

Figure 1:
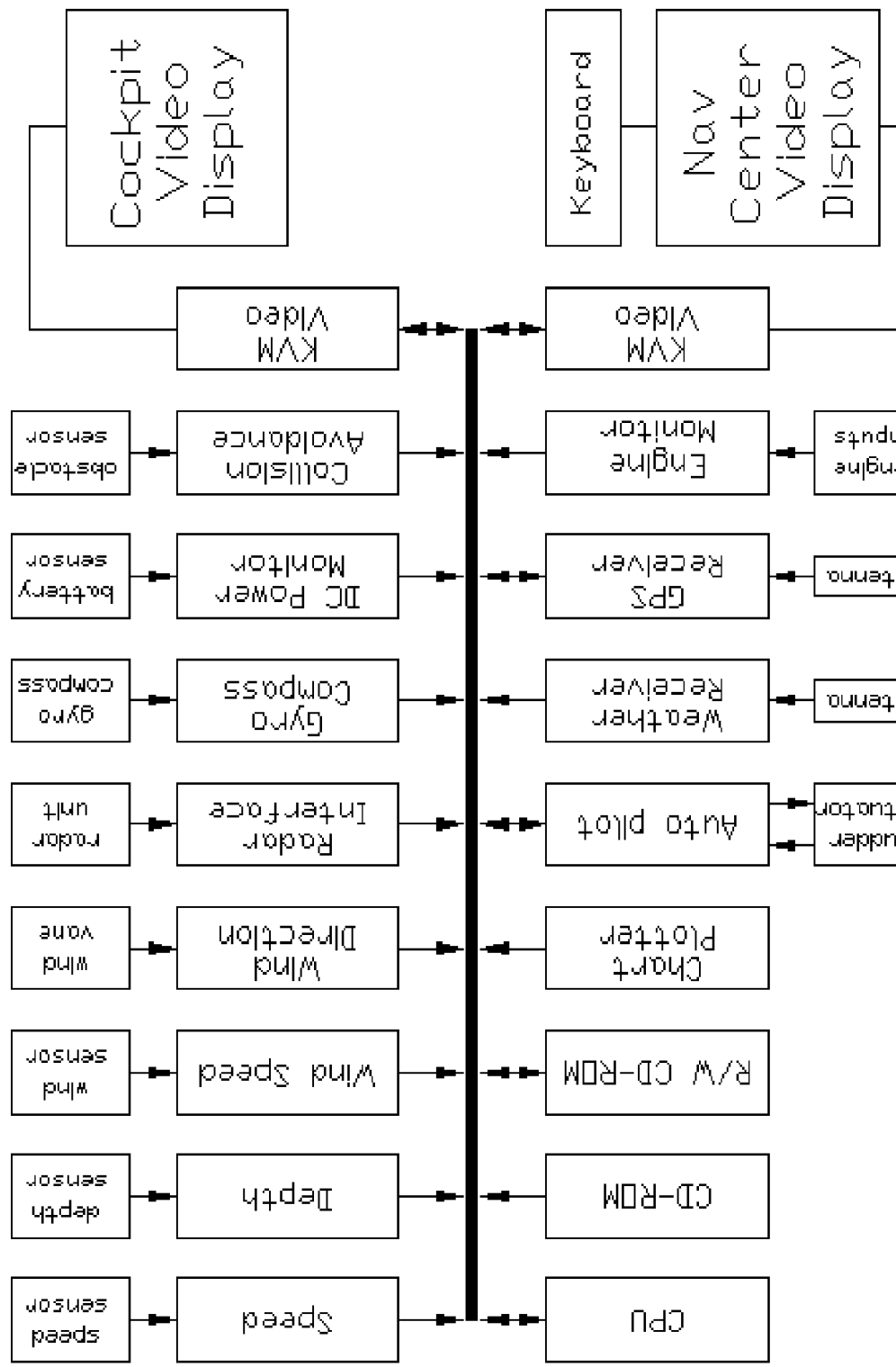
FIG. 1: Schematic representation of the system
Figure 2:
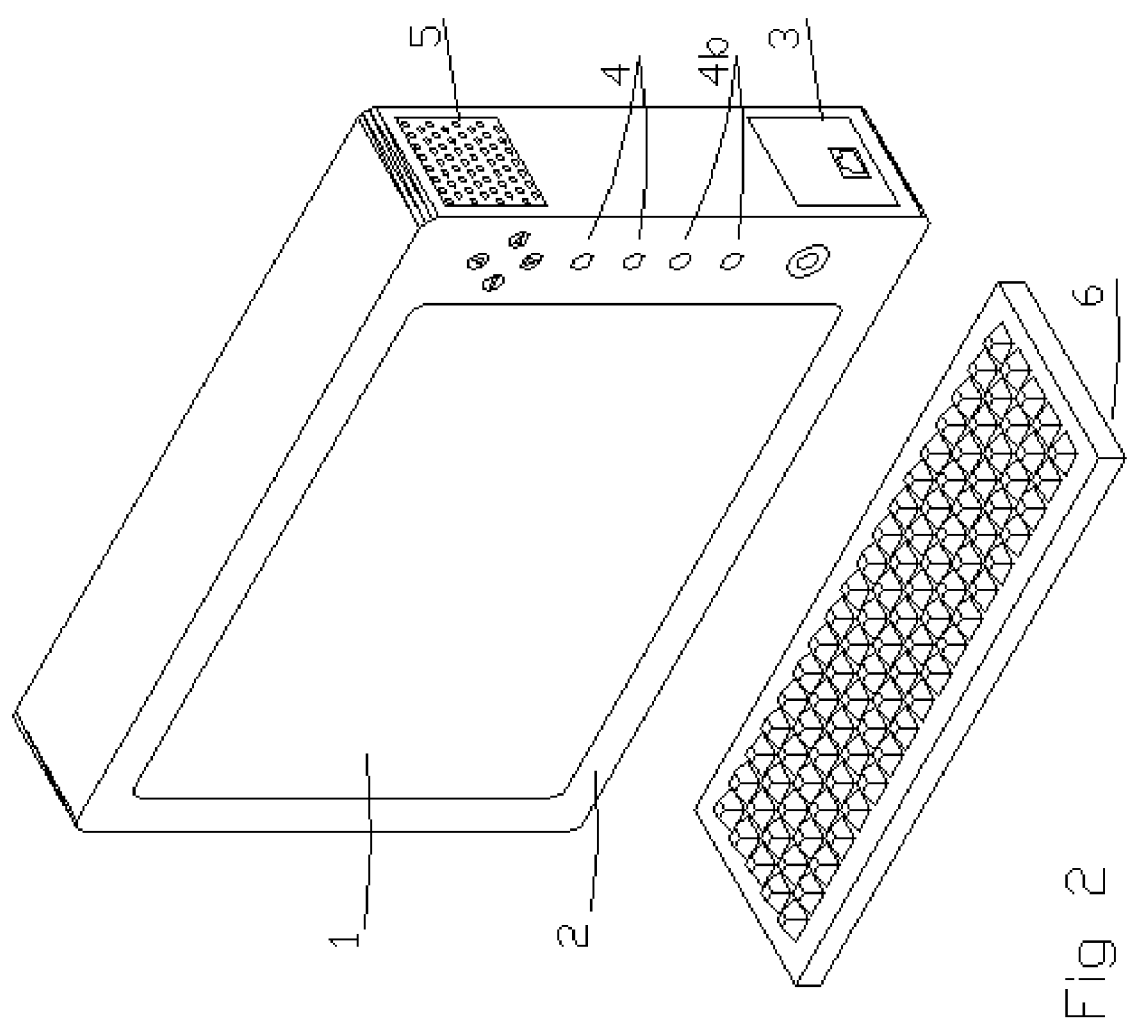
FIG. 2: The video interface unit and keyboard

Referring to the drawings a component navigational system for a sailing vessel is comprised of one or multiple video interface units as depicted in FIG. 2 and other components. The Video Interface Unit (or VIU) is a video display device consisting of a flat panel video display 1 that is housed in a waterproof enclosure 2. The flat panel display unit may be a TFT VGA 10.4 inch panel display, however many other panel sizes are available. This unit will have sufficient illumination intensity to provide good visibility in full sunlight. The display unit may have an optional "touch screen" interface.

Video signals, keypad and mouse control signals are communicated to and from the VIU via a keyboard-video-mouse (or KVM) interface unit FIG. 2, 3. The KVM unit allows all three types of control signals to be sent and received over a single CAT5 communication cable.

The VIU may have multiple function keys FIG. 2, 4 for a specific function, and the unit may have multiple "soft keys" 4b that function differently from display page to display page. The user may display several different graphic pages, or access menus, or configure system parameters by using the function and/or soft keys. The VIU will also have a waterproof speaker 5 for audio alarms or signals. Multiple VIUs may be used with this system. These video units can be easily mounted and wired requiring only 12-volt power and a single CAT5 cable. A VIU may also be equipped with a keyboard 6 for a more conventional interface at a protected location such as the navigation center.

Figure 3:
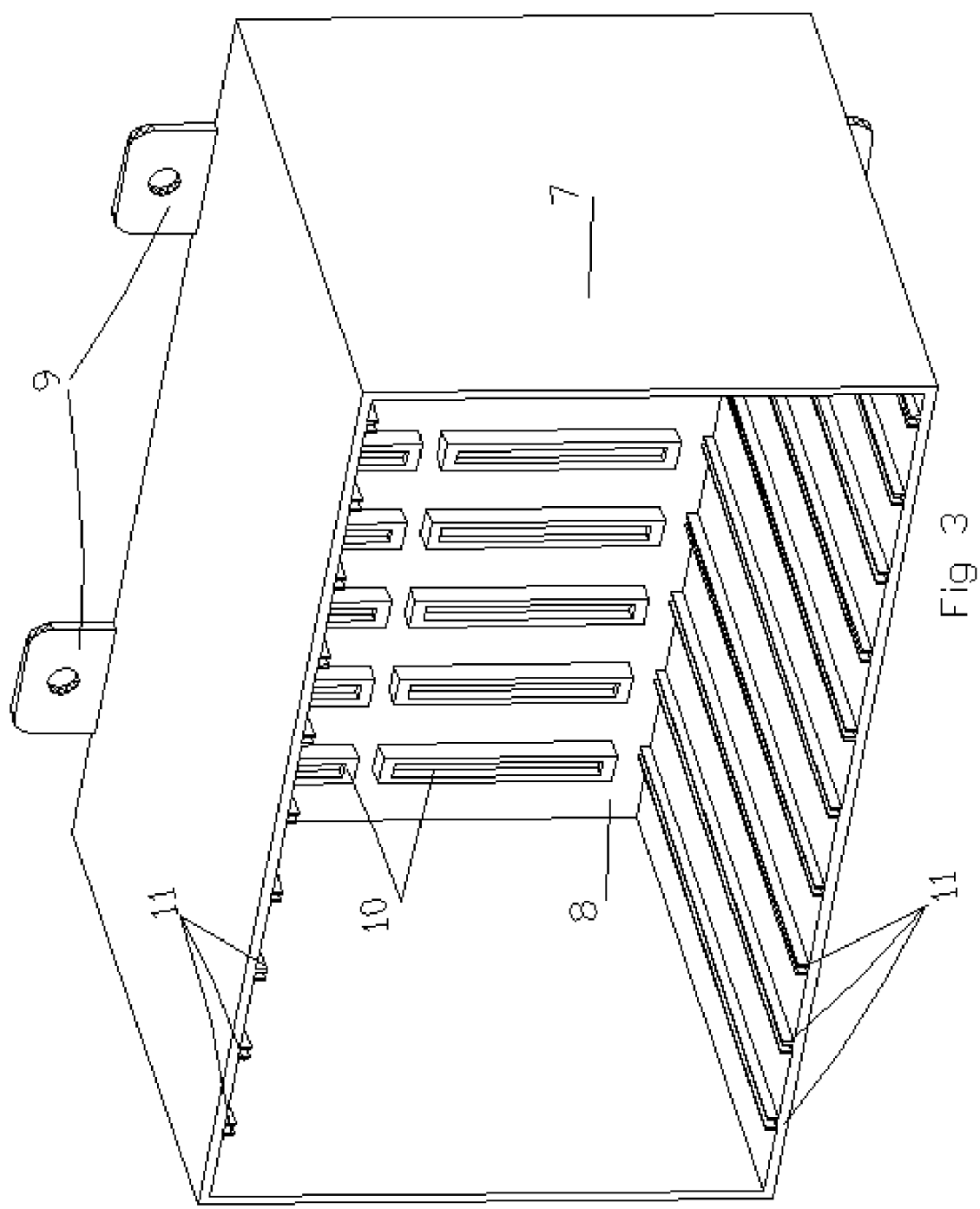
FIG. 3: The card cage unit

Referring to the drawings a component navigational system for a sailing vessel consists of a card-cage unit as depicted in FIG. 3 and other components. This illustration depicts a card-cage with ten slots, however the card cage may be provided with more or fewer slots as required. Additional card-cage units may also be connected to the system to increase the number of cards used in a given system. The card-cage unit (or CCU) is comprised of a framework 7 to support and protect the purpose-built printed circuit cards, and a back plane 8, which has integrated communication and power buses. The framework will be secured into a protective housing FIG. 4, 25 by mounting tabs FIG. 3, 9 located on the upper and lower external horizontal surfaces of the unit.

The back plane FIG. 3, 8 shall have a bus work that will have multiple parallel electrical conductors to provide a communication pathway between the CPU card and the purpose-built printed circuit boards. Multiple parallel electrical conductors will also be provided to distribute power from the power supply card to the printed circuit boards and the CPU. The back plane will have one or multiple edge connector sockets 10 for each slot space. These sockets will electrically connected to the power and communications buses. These sockets will "mate" with electrical contacts FIG. 5, 12 on the purpose-built printed circuit boards such that these boards will be electrically connected to the power bus and the communication bus. Card guides FIG. 3, 11 will be provided on the upper and lower interior horizontal surfaces. These guides will ensure that the printed circuit cards properly align with the edge connectors located on the back plane.

Figure 4:
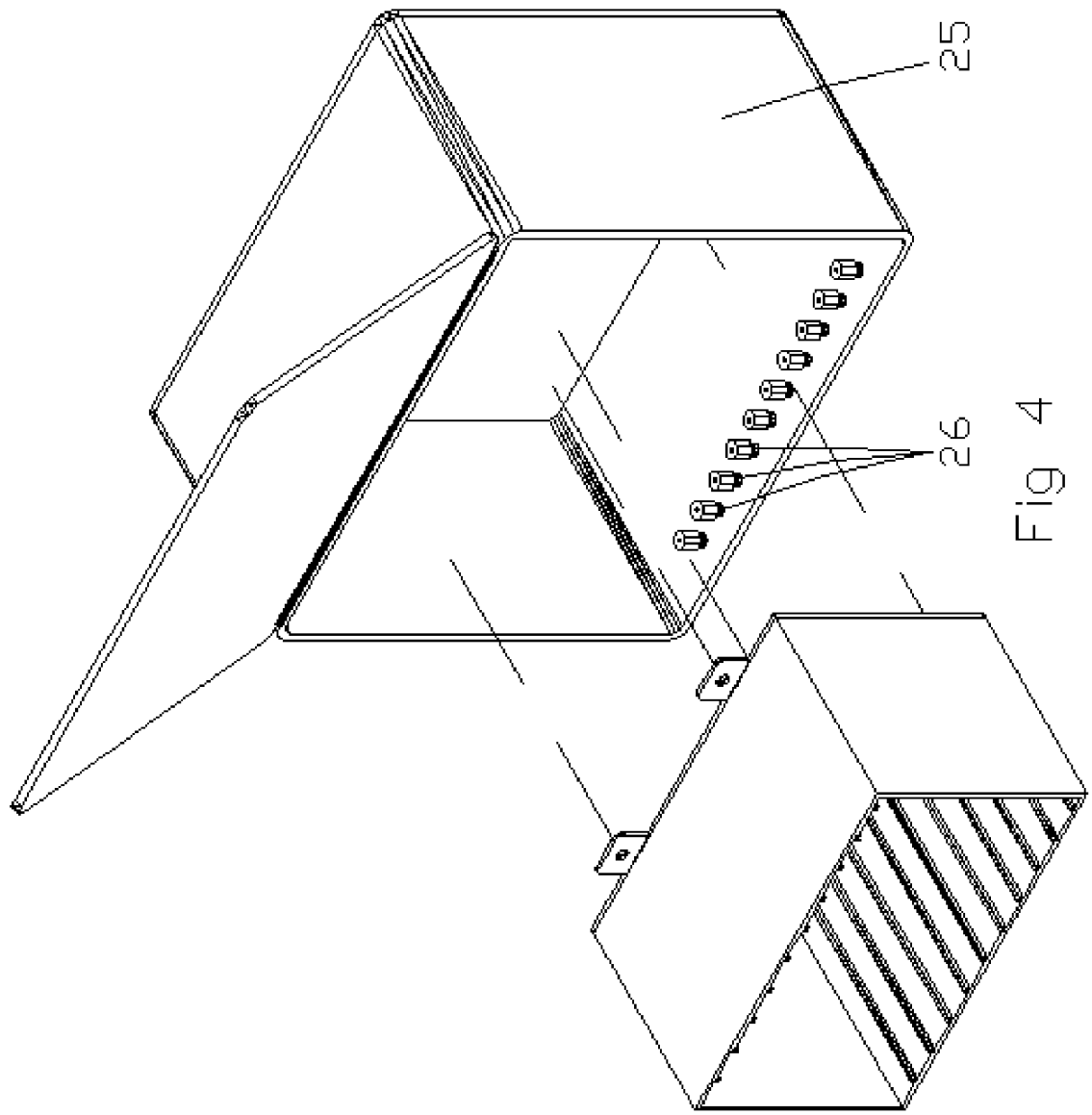
FIG. 4: The waterproof enclosure and card cage unit

FIG. 4 illustrates the CCU is to be housed in an enclosure 25 to protect the unit from impact and exposure to harsh or corrosive environments. This unit will have appropriate penetrations for cable and wire connections, as well as appropriate wiring and waterproofing appliances 26 such as CGB cable or bulkhead seal fittings.

Figure 5:
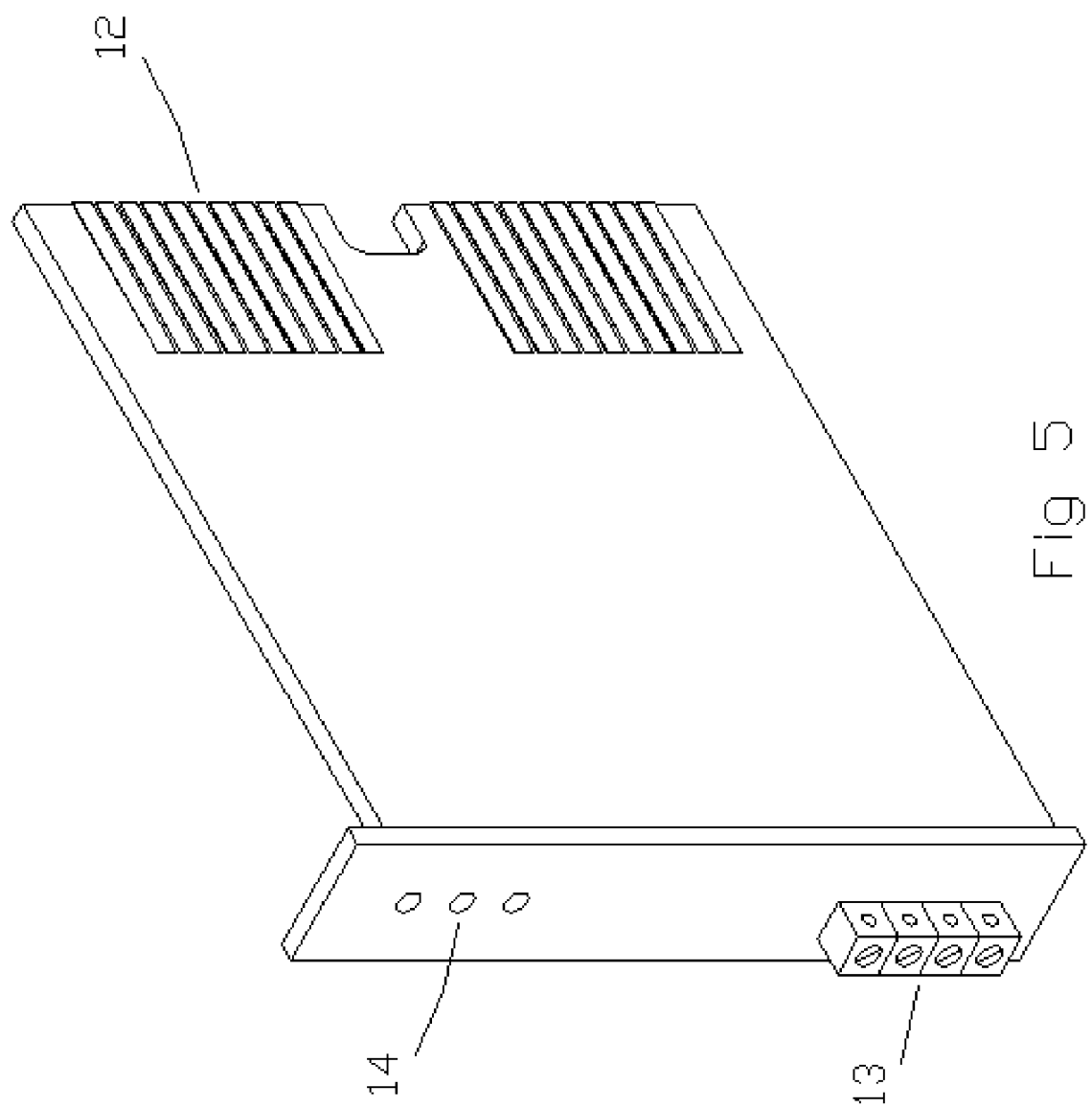
FIG. 5: The printed circuit boards

Referring to the drawings a component navigational system for a sailing vessel comprising multiple purpose-built printed circuit boards as depicted in FIG. 5 and other components. The purpose-built circuit boards will be designed to perform one or multiple functions such as a depth sounder and speed indicator circuitry combined on one circuit board FIG. 7, 22. The purpose-built circuit boards will be populated with sufficient electrical or electronic components to perform the specific function(s). These boards may include firmware and/or software suitable for the specific function. The circuit boards will have edge contacts 12 on the inner edge (the back edge) of the board. These contacts are designed to "mate" to the edge connector sockets located on the back plane FIG. 3, 10. The circuit boards will then be connected to a specific input sensor (or transducer), which will be suited for that board's specific function(s). The transducer will be connected to the outer edge (the front side) of the circuit board by means of a terminal strip FIG. 5, 13 or some other specific connection device. These circuit boards will be equipped with LEDs 14, which will indicate the operating status of the boards. Other purpose-built circuit boards may include but are not limited to a wind speed and direction board FIG. 7, 23, a GPS receiver board, a radar interface board, an autopilot interface board, a chart-plotter board, a weather band receiver board, an engine input board, a collision avoidance board, a DC power monitor board, a gyro-compass board, a CD-ROM board or a read/write CD-ROM board.

Referring to the drawings a component navigational system for a sailing vessel will consist of multiple sensors and transducers as depicted in FIG. 6 and other components. The transducers will be electronic or electro/mechanical in nature. An electronic transducer may be but is not limited to a temperature probe or a sonar transceiver 15. An electro-mechanical sensor may be but is not limited to a paddle-wheel type speed pick-up 16 or a wind vane and wind speed indicator 17. Other devices may be but are not limited to an external GPS antenna 18.

Referring to the drawings a component navigational system for a sailing vessel comprising a power supply card FIG. 7, 19, a CPU card 20 and a video interface card with KVM interface 21 and other components.

The power supply card FIG. 7, 19 will have the same physical dimensions and design as the purpose-build printed circuit boards. This power supply will attach to the back plane via the edge connector socket(s), and it will thus be connected to the power bus. The power supply will occupy one slot in the card-cage unit. The power supply card will draw power from the boat's 12-volt DC power system, and provide filtered, protected and regulated voltage to the components of the navigation system.

The central processing unit FIG. 7, 20 (or CPU) will have the same physical dimensions and design as the purpose-build printed circuit boards. This CPU will attach to the back plane via the edge connector socket(s), and it will thus be connected to the communication and power buses. The CPU will occupy one slot in the card-cage unit. The CPU will consist of a processor, memory and the necessary electronic components to produce a functional computer/controller. Large amounts of cartographic data, programs, etc. can be downloaded to the unit via a serial link from a personal computer or from a CD-ROM unit. The system may use any operating system desired, and any application and graphics program can be developed to convey a wide variety of navigational and cartographic information.

The video interface card FIG. 7, 21 (or VIC) will have the same physical dimensions and design as the purpose-build printed circuit boards. This VIC will attach to the back plane via the edge connector socket(s), and it will thus be connect to the communications and power buses. The VIC will occupy one slot in the card-cage unit. The VIC will consist of a KVM interface circuit and the necessary electronic video components to support a VGA display. The Video Interface Card will connect directly to the Video Interface Unit via a CAT5 cable.

What is claimed is:

1. A component navigational system, comprising:
   a video interface unit adapted to be disposed on a marine vessel;
   a card-cage unit adapted to be disposed on a marine vessel, wherein the card-cage unit comprises;
      at least a first purpose-built printed circuit board having a central processing unit, wherein the central processing unit is in communication with the video interface unit;
      at least a second purpose-built printed circuit board having a power supply;
      at least a third and fourth purpose-built printed circuit board each having a different function selected from the group consisting of: depth sounder, speedometer, anemometer, gyrocompass, GPS receiver, chart plotter, radar interface, autopilot interface, weather band receiver, CD-ROM unit, read/write CD-ROM unit, engine parameter monitor, DC power monitor, and collision avoidance unit,
      wherein the at least first, second, third, and fourth purpose-built printed circuit board have the same physical dimensions;
      a parallel signal bus connecting the signal circuits of the at least first, second, third, and fourth purpose-built printed circuit boards;
      a power distribution bus connecting the signal circuits of the at least first, second, third, and fourth purpose-built printed circuit boards; and
      multiple input sensors and output devices connected to the purpose-built printed circuit boards.

2. The component navigation system of claim 1, wherein the video interface unit comprises a flat panel display.

3. The component navigation system of claim 2, wherein the video interface unit utilizes multiple function keys and/or soft keys to provide user input.

4. The component navigation system of claim 2, wherein the video interface unit utilizes a touch screen and/or a keyboard to provide user input.

5. The component navigation system of claim 2, 3 or 4, wherein the flat panel display, function keys, soft keys and the touch-screen are presented in a waterproof housing which protects the electronic components.

6. The component navigation system of claim 2, 3 or 4, wherein the flat panel display, the function keys, the soft keys and the touch-screen are in signal communication with the system by means of CAT5/KVM interface.

7. The component navigation system of claim 2, 3, or 4, wherein the video interface unit provides data displays, cartographic displays, configuration menus, and a means for user input.

8. The component navigation system of claim 1, wherein the card-cage unit comprises a back plane which has multiple integral bus structures and a framework to house the purpose-built printed circuit boards.

9. The component navigation system of claim 8, wherein the parallel signal bus comprises multiple electrical conductor lines located on the back plane.

10. The component navigation system of claim 8, wherein the power distribution bus has multiple electrical conductor lines located on the back plane.

11. The component navigation system of claim 9 or 10, wherein the signal conductors and the power conductors of the back plane are electrically connected to edge connector sockets.

12. The component navigation system of claim 1, wherein the card-cage unit is housed in a protective waterproof enclosure.

13. The component navigation system of claim 1, wherein the power supply comprises a voltage regulator, a surge suppressor and filters designed to provide clean electric power to the various components in the card-cage unit.

14. The component navigation system of claim 13, wherein the power supply resides in the card-cage unit, and the power supply is attached to the power bus of a back plane via edge connector sockets.

15. The component navigation system of claim 1, wherein the central processing unit comprises a processor, memory, an operating system and the necessary electronic components to produce a functional computer.

16. The component navigation system of claim 15, wherein the central processing unit is designed to reside in the card-cage unit, and the central processing unit is attached to the signal bus of a back plane via edge connector sockets.

17. The component navigation system of claim 1, wherein the purpose-built printed circuit boards have electrical components sufficient to perform the functions.

18. The component navigation system of claim 17, wherein the purpose-built printed circuit boards have edge contacts on an inner edge of the purpose-built printed circuit board, and wherein the edge contacts are mated to edge connector sockets located on a back plane.

19. The component navigation system of claim 17, wherein the purpose-built printed circuit boards are connected to a specific input sensor which is suited for the specific input sensor's function, and wherein the specific input sensors are connected to an outer edge of the purpose-built circuit board.

20. The component navigation system of claim 17, wherein the third purpose-built printed circuit board has the function of a video interface card.

21. The component navigation system of claim 20, wherein the video interface card further provides the function of a CAT5/KVM interface.

22. The component navigation system of claim 21, wherein the video interface unit and the video interface card are in signal communication by means of the CAT5/KVM interface.

23. The component navigation system of claim 17, wherein the third purpose-built printed circuit board provides the function of a depth sounder.

24. The component navigation system of claim 17, wherein the third purpose-built printed circuit board provides the function of a speedometer.

25. The component navigation system of claim 17, wherein the third purpose-built printed circuit board provides the function of an anemometer.

26. The component navigation system of claim 17, wherein the third purpose-built printed circuit board provides the function of a gyrocompass.

27. The component navigation system of claim 17, wherein the third purpose-built printed circuit board provides the function of a GPS receiver.

28. The component navigation system of claim 17, wherein the third purpose-built printed circuit board provides the function of a chart plotter.

29. The component navigation system of claim 17, wherein the third purpose-built printed circuit board provides the function of a radar interface.

30. The component navigation system of claim 17, wherein the third purpose-built printed circuit board provides the function of an autopilot interface.

31. The component navigation system of claim 17, wherein the third purpose-built printed circuit board provides the function of a weather band receiver.

32. The component navigation system of claim 17, wherein the third purpose-built printed circuit board provides the function of a CD-ROM unit.

33. The component navigation system of claim 17, wherein the third purpose-built printed circuit board provides the function of a read/write CD-ROM unit.

34. The component navigation system of claim 17, wherein the third purpose-built printed circuit board provides the function of an engine parameter monitor.

35. The component navigation system of claim 17, wherein the third purpose-built printed circuit board provides the function of a DC power monitor.

36. The component navigation system of claim 17, wherein the third purpose-built printed circuit board provides the function of a collision avoidance unit.

37. The component navigation system of claim 1, wherein the input sensors comprise electrical or electro/mechanical devices to provide specific data.

38. The component navigation system of claim 1, wherein the output devices comprise electric or electro/mechanical apparatus to perform a specific task.

\* \* \* \* \*